United States Patent
Maganas (10) Patent No.: US 7,759,579 B2
(45) Date of Patent: Jul. 20, 2010

(54) MONOMOLECULAR CARBON-BASED FILM FOR ENHANCING ELECTRICAL POWER TRANSMISSION

(76) Inventor: Thomas C. Maganas, 1200 Ardmore, Manhattan Beach, CA (US) 90266

( * ) Notice: Subject to any disclaimer, the term of this patent is extended or adjusted under 35 U.S.C. 154(b) by 0 days.

(21) Appl. No.: 12/396,609

(22) Filed: Mar. 3, 2009

(65) Prior Publication Data

US 2010/0155132 A1    Jun. 24, 2010

Related U.S. Application Data

(63) Continuation-in-part of application No. 12/337,862, filed on Dec. 18, 2008.

(51) Int. Cl.
*H01B 7/00* (2006.01)
(52) U.S. Cl. .............. 174/110 R; 174/113 R; 174/113 A; 174/120 R
(58) Field of Classification Search ............. 174/110 R, 174/113 R, 113 C, 120 R, 120 SC, 110 F
See application file for complete search history.

(56) References Cited

U.S. PATENT DOCUMENTS

| | | | | |
|---|---|---|---|---|
| 4,559,973 | A * | 12/1985 | Hane et al. ............... | 138/138 |
| 4,866,212 | A * | 9/1989 | Ingram ...................... | 174/28 |
| 5,143,745 | A | 9/1992 | Maganas et al. | |
| 5,676,070 | A | 10/1997 | Maganas et al. | |
| 5,928,618 | A | 7/1999 | Maganas et al. | |
| 6,235,247 | B1 | 5/2001 | Maganas et al. | |
| 6,264,908 | B1 | 7/2001 | Maganas et al. | |
| 6,457,552 | B2 | 10/2002 | Maganas et al. | |
| 6,520,287 | B2 | 2/2003 | Maganas et al. | |
| 6,962,681 | B2 | 11/2005 | Maganas et al. | |
| 7,459,635 | B2 * | 12/2008 | Belli et al. ............... | 174/110 R |
| 7,509,798 | B2 | 3/2009 | Maganas | |

OTHER PUBLICATIONS

Notice of Allowance dated Feb. 5, 2010 cited in U.S. Appl. No. 12/337,862 (Copy Attached).

* cited by examiner

*Primary Examiner*—William H Mayo, III
(74) *Attorney, Agent, or Firm*—Workman Nydegger (57) ABSTRACT

Power cable shields having a monomolecular carbon-based film are placed around electrical power lines to reduce power losses and enhance transmission of electricity. The shield may be a solid metal tube or a material wrapped around a power cable. The monomolecular carbon-based film is deposited on the shield, for example, using a reactor that includes a bed of silica coupled to a diesel engine to produce a stream of dehydrated hydroxyl radicals that become hydrated due to reactions of supercritical water and muon methyl radicals. A shielded electrical power includes a shield positioned around and fully enclosing the power line to prevent atmospheric loss of electrical power. An existing power line can be retrofitted by placing one or more surface treated sleeves around the existing power line. Periodically spaced apart magnets can be positioned within the electrical wire shield to further boost power and voltage through the electrical power line.

36 Claims, 9 Drawing Sheets

FIG. 11

MONOMOLECULAR CARBON-BASED FILM FOR ENHANCING ELECTRICAL POWER TRANSMISSION

CROSS REFERENCE TO RELATED APPLICATION

This application is a continuation-in-part of copending U.S. application Ser. No. 12/337,862, filed Dec. 18, 2008, the disclosure of which is incorporated herein in its entirety.

BACKGROUND OF THE INVENTION

1. The Field of the Invention

The present invention relates to a monomolecular carbon-based film and an electrical shield incorporating such film for enhancing power transmission over an electrical power line and eliminating corona discharge.

2. The Related Technology

Electrical power lines are used to transmit electricity from power plants to Grid substations, then to homes, factories and other end users and are found all over the world. Power lines are transmission cables made up of a precisely set of woven wires. Current flows over and through the skin of each of the woven wires that form the cable. Because current typically flows over transmission cables that are without insulation, a major problem is corona discharge, which is composed of an electromagnetic field of electrons. When a corona is fully crested the dam of electrons cracks, resulting in a loss of voltage and release of electrons to the atmosphere. To compensate for voltage and current losses, power must be regenerated and/or boosted about every fifty miles between Grid substations to recharge current. Up to 60% of the average power plant production of energy is lost to corona discharge, as reported in Washington D.C. by a Dr. Clayton Teague, Director National Nanotechnology Coordination and Office of Nano scale Science, Engineering, and Technology. Dr. Teague explained there is an acute need to replace a portion of such power losses with nuclear power stations. However, to replace even 1% of such power loss would require two nuclear power plants at a cost over $30B, with huge political resistance.

In view of the foregoing, there is a long-felt but unsatisfied need to provide a more efficient method of transporting electrical power over power transmission lines, to which no substance including rubber has ever successfully been found to reliably insulate electrical current energy over transmission lines without melting the cable due to electron friction and associated heat build-up.

BRIEF SUMMARY

The invention relates to a monomolecular carbon-based film, and its use to insulate currant flow over an electrical power line. Power lines transmit current over cables that are generally open to the atmosphere and there are is reliable way, including the use rubber, to a power transmission cable. In order to enhance power transmission insulation is provided by a unique film comprised of elongated, nano-scale carbon-based molecules aligned on a surface of a shield. The elongated carbon molecules are aligned side-by-side to form the monomolecular film, which has no film breaks, cracks or other discontinuities and cannot be penetrated by electrons. Positioning the shield so as to insulate an electrical power line prevents corona discharge of electrons and enhances power transmission.

The invention also relates to a process for forming and depositing the monomolecular carbon-based film on a shield or intermediate product used to form a shield, a process for posting the shield or intermediate product around a power line, and a process for achieving enhanced power transmission. The film encloses the cable and stops penetration by electrons, which reduces corona discharge.

The invention also relates to research suggesting that a power generating device can be provided for increasing the voltage within a metal substrate encased within the inventive shield that includes the carbon-based monomolecular film. The film on the metal forms a shield that completely encapsulates the electrons and keeps them from penetrating through the film. Magnets are placed outside and around the substrate in order to reflect electrons back to the magnets that form a corona between the shield and magnets with a continuous rotation of the electrons between the shield and magnets. The result is an increase in output voltage that is greater than the input voltage, suggesting that a generator battery resulted from research by the inventor relating to power transmission.

These and other advantages and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF EXEMPLARY EMBODIMENTS

The invention relates to a monomolecular carbon-based film used to shield current that includes electrons over an electrical power line in order to enhance transmission of current over the power line. The invention also relates to methods for forming and depositing the monomolecular carbon-based film on an electron impenetrable shield or intermediate product used to form an electron impenetrable shield and also positing the an electron impenetrable shield or intermediate product around a power line to yield a shielded power line. The shield insulates the power over woven lines that form a cable and prevents corona discharge of electrons outside of the power line, thereby enhancing current transmission and possibly enhancement of voltage. Magnets can be positioned within the tubular shield every 20-50 miles to increase or accelerate current flow through the shield in order to further enhance power transmission over the power line. The shield insulates and prevents loss of voltage from the power line and prevents corona discharge of electrons outside of the power line.

A similar phenomenon permits for a small increase in voltage through a metal substrate treated with the monomolecular carbon-based film and surrounded by magnets. The film encapsulates and shields electrons within the substrate and keeps them from penetrating through the film. Magnets placed around the substrate enhance movement of electrons passing through the substrate so as to produce an output voltage that is greater than the input voltage. In the context of a tubular shield, magnets can narrow the flow of electrons to increase their flow.

As used herein, the term "monomolecular carbon-based film" refers to film that is made by aligning elongated nano-scale, carbon-based molecules that form a film that is a single molecule thick. The film is dense, strong, durable and continuous, indelible, and chemically resistant. The elongated nano-scale carbon-based molecules are aligned shoulder-to-shoulder, are essentially parallel to each other, and lock to any substrate surface. Silicon nitride particles produced as a byproduct form a dome cap over the elongated carbon-based molecules, which can be removed to leave the monomolecular carbon-based film.

Figure 3A:
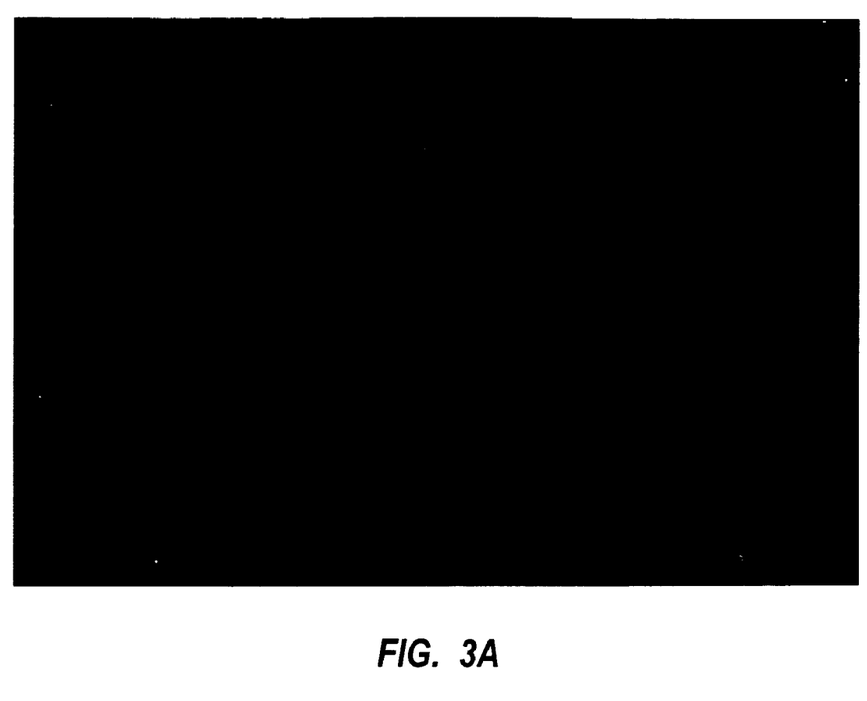
FIG. 3A is a photograph of the material shown in FIG. 2A but magnified 10 times to show that the film is comprised of elongated tubes.
Figure 3B:
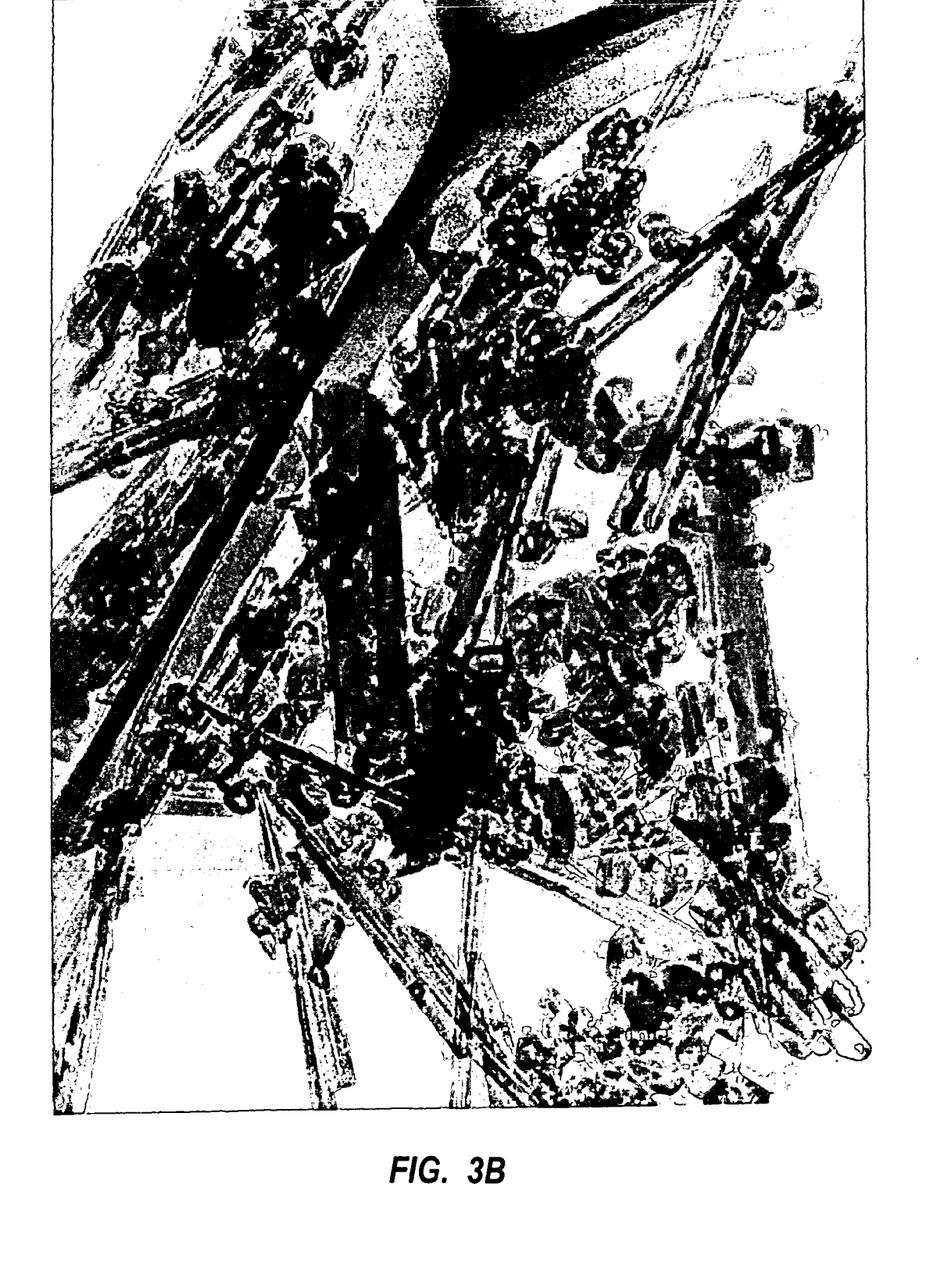
FIG. 3B is a photograph that shows a material similar to and verifies the elongated tubular nature of the material shown in FIG. 3A.
Figure 3C:
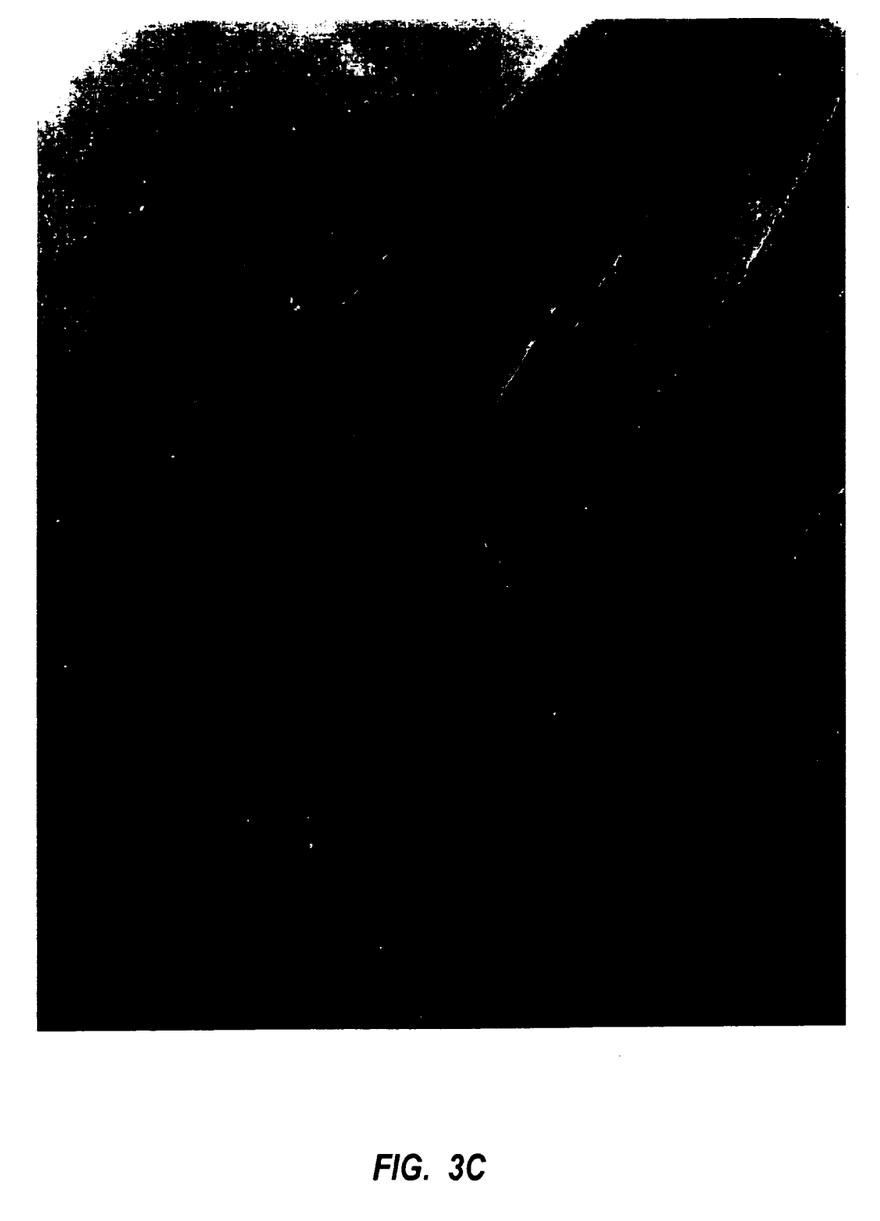
FIG. 3C is a photograph of the tubular material of FIGS. 3A and 3B at higher magnification.
Figure 4:
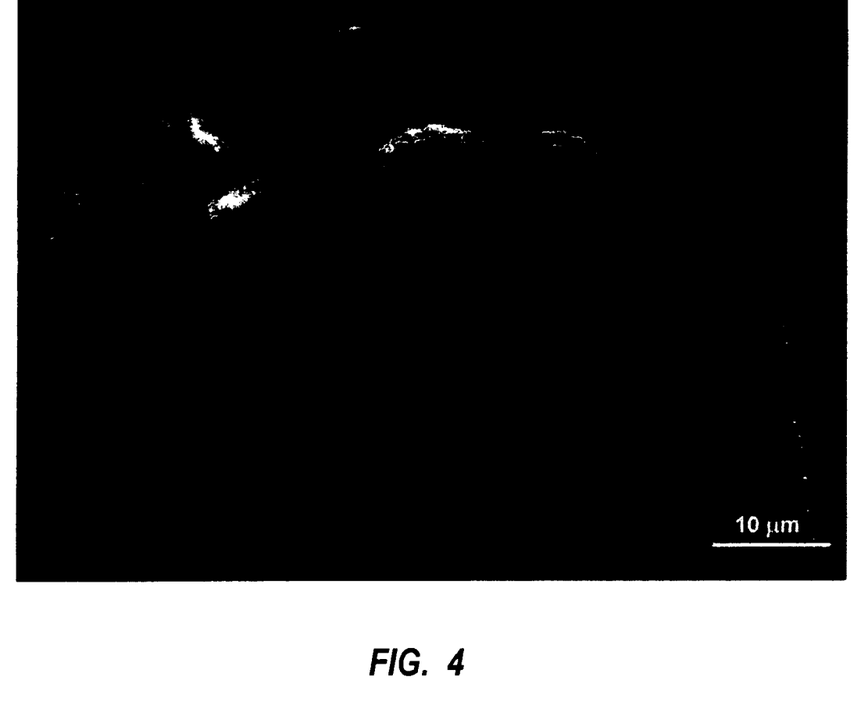
FIG. 4 is a nano-scale photograph that shows a portion of the tubular material shown in FIGS. 3A-3C at higher magnification.
Figure 5:
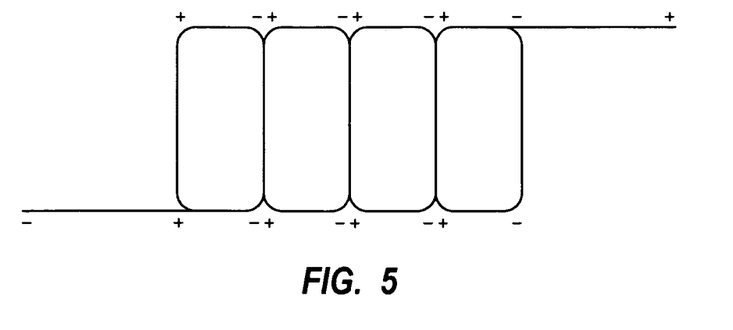
FIG. 5 schematically illustrates a proposed arrangement of carbon molecules in which oppositely charged sides are aligned adjacent to each other.

As shown in FIGS. 1-4, which are a series of photographs at various levels of magnification, elongated carbon-based molecules that make up the monomolecular film are tubular with a dome cap top and are precisely 30 angstroms wide by 50 angstroms long. When compressed, the molecule height is increased to 70 angstroms without cracking the molecule, and when compression is released returns to 50 angstoms. Individual molecules have a high affinity for each other and are believed to be electromagnetically charged with negative and positive ends when aligned in an orderly fashion to form the monomolecular film and they form an unbreakable bond that creates a durable, continuous, indelible, chemically resistant surface film or deposit (FIG. 5).

The outer or exposed surface of the elongated carbon-based, nano-scale molecules is a product derivative of silicon or silicon nitride particles that form into tubular shapes, and which produce (or chemically grow) the elongated carbon-based nano-scale molecules. This has been verified using a new and extremely powerful electron microscope that produced a photograph released by Johannes Gutenberg University in Mainz Germany (FIG. 4). Excess silicon or silicon nitride particles (which are generally in the form of pods or fig leaves) can be removed through surface treatment (i.e., stripping with hydrofluoric acid with no damage to the carbon-based molecules deposited beneath the silicon) or they can be ignored or removed with friction. The elongated carbon-based, nano-scale molecules are tubular with a dome top. The existence of the monomolecular carbon-based film can be detected using a volt meter and, in addition and is evidenced by the altered properties of substrates treated therewith (e.g., shielding a power line prevents corona discharge; electrons cannot penetrate the shield, substrate has reduced friction, reduced temperatures, etc.).

Figure 1:
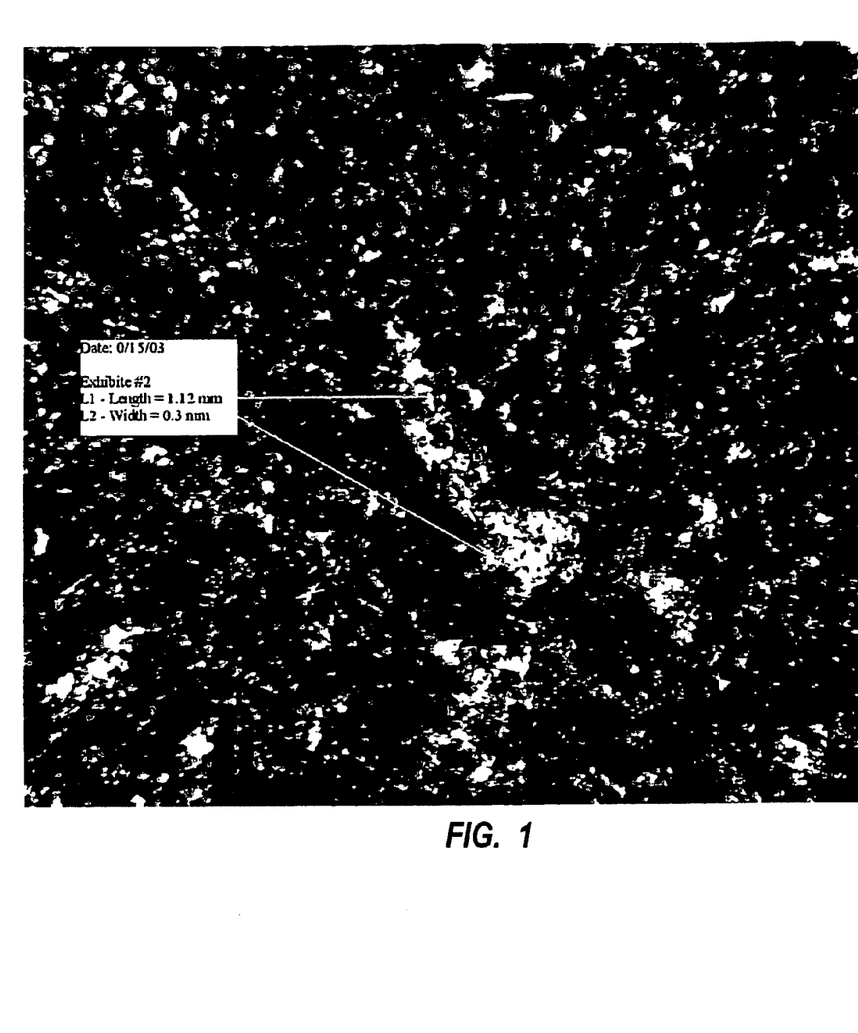
FIG. 1 is a photograph of a monomolecular film magnified 25 times using a 100 mm lens.

FIG. 1 shows a magnified photograph of a monomolecular carbon-based film produced using a diesel engine coupled with a reactor having a bed of silica particles. Methods for manufacturing the film are discussed below in greater detail. The material comprising the film in the photograph of FIG. 1 is shown further magnified in FIG. 2A. FIG. 2B is a magnified photograph of a similar material produced as claimed by NEC of Japan (and produced by Johannes Gutenberg University). The similarities between the materials shown in FIGS. 2A and 2B are readily apparent, particularly when viewing higher resolution originals rather than reproduced copies, with the magnified photograph of FIG. 2B providing independent verification of the existence and nature of the material shown in FIG. 2A.

Figure 2A:
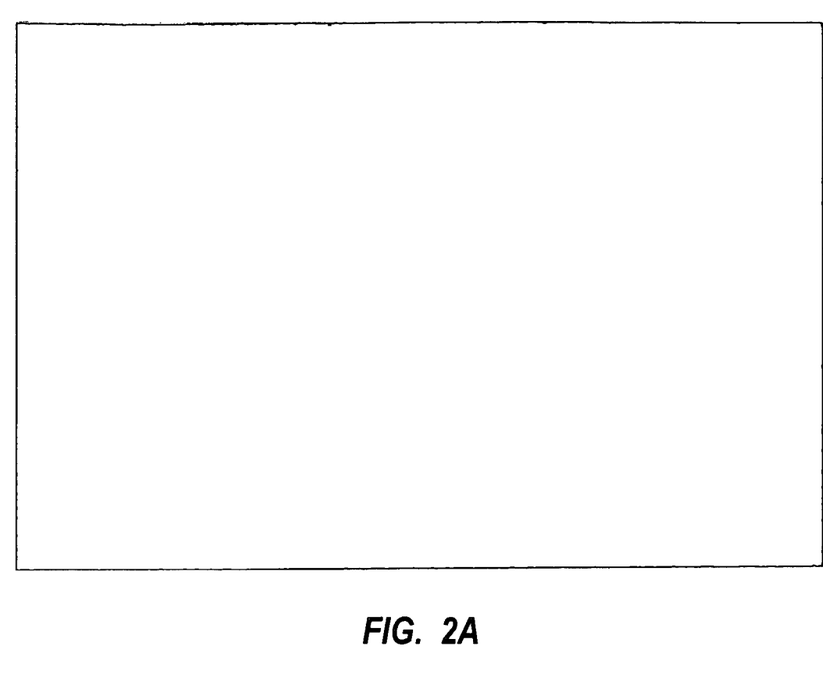
FIG. 2A is a three dimensional photograph of the film shown in FIG. 1 magnified 10 times to show a closer view of the film structure.
Figure 2B:
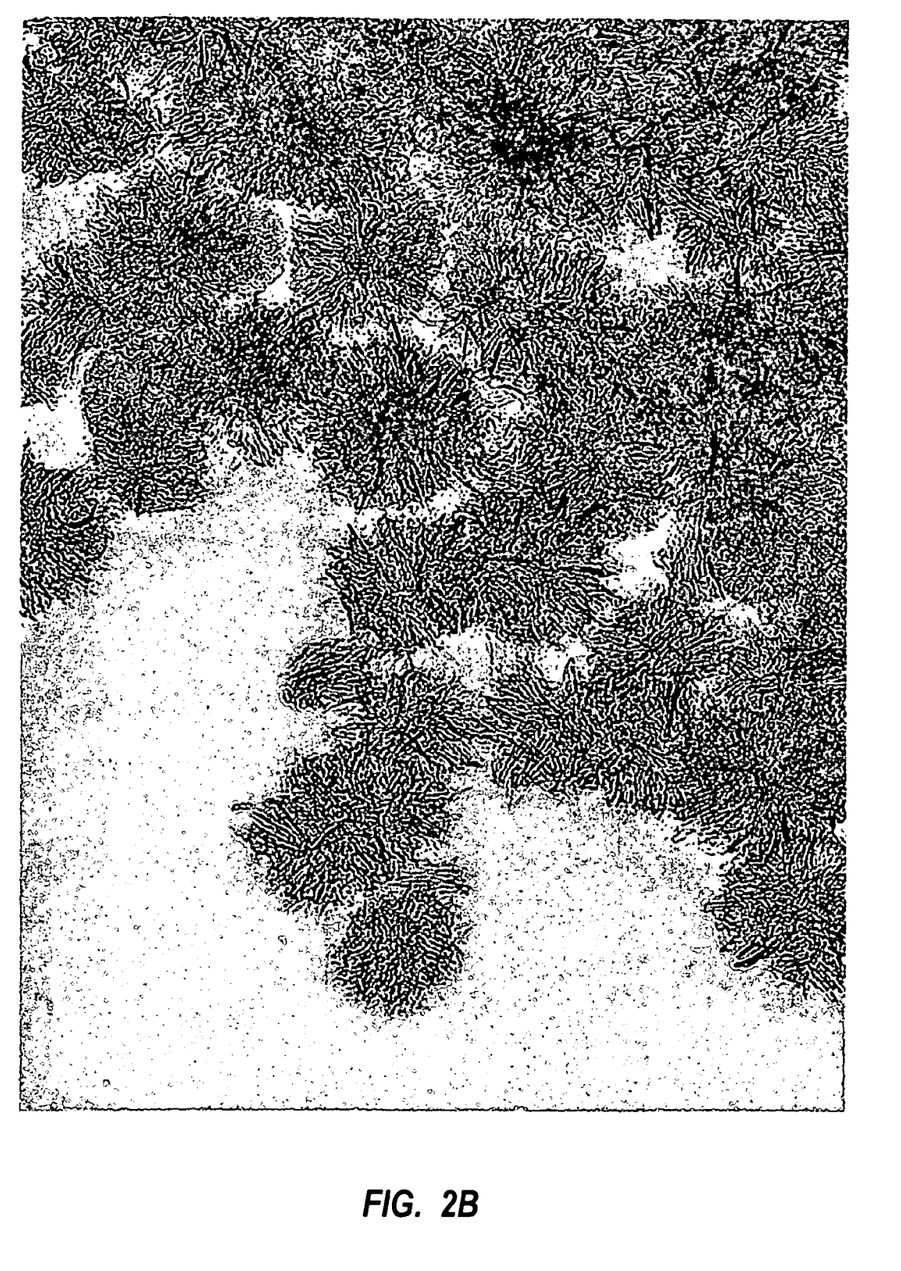
FIG. 2B is a photograph that shows a material similar to and verifies the structure of the material shown in FIG. 2A.

The material shown in FIG. 2A was further magnified in the photograph shown in FIG. 3A, which better indicates the elongated nature of the carbon-based nano-scale particles within the monomolecular carbon-based film of FIGS. 1 and 2A. FIG. 3B is a magnified photograph of a similar elongated monomolecular material produced by Johannes Gutenberg University in Mainz, Germany. The similarities between the materials shown in FIGS. 3A and 3B are readily apparent, particularly when viewing higher resolution originals rather than reproduced copies, with the magnified photograph of FIG. 3B providing independent verification of the existence and nature of the material shown in FIG. 3A. FIG. 3C is a further magnification of a material similar to those shown in FIGS. 3A and 3B.

FIG. 4 is a nano-scale photograph taken by a new German electron microscope with a huge increase in power at Johannes Gutenberg University that shows elongated carbon-based nano-scale molecules. The molecules include a dome top that is apparently made of carbon and also a material believed to be silicon-based particles that, when seen through a standard electron microscope, appear as tubular and extending around the elongated carbon-based, nano-scale molecules and leave a mark of the break.

The elongated carbon-based, nano-scale molecules that make up the monomolecular carbon-based film withstood 40 gigapascals or 400,000 atmospheres of pressure before cracking. Further testing of the dome top molecule showed that its interior withstood 350 gigapascals of electron pressure before cracking. These reports are now recognized by other German universities, as well as the university of Finland and Cornell University in the USA. The monomolecular film also led to other uses, including the invention of a new "battery" formed by producing a continuous electron corona in a magnetic field by bombarding both sides of a metal plate with electrons, producing circles of magnetically controlled current energy that produces a continuous currant. The monomolecular film deposited to metal rejects electron penetration to produce a continuous flow of amps without the need to recharge the "battery". The monomolecular film though almost invisible is easily seen with reflection of light, and electron rejection that can be validated with a common volt meter.

The discovery of elongated carbon-based molecules that when aligned form a monomolecular film was originally discovered and developed in 1987 by Tom Maganas and Al Harrington. Al Harrington identified and described precisely the size and shape of the elongated molecule, which was measured with an ellipsometer to be 30 angstroms by 50 angstroms. When compressed the molecule increased in height to 70 angstroms without the normal cracking found in all other known molecules (as now validated by Johannes Gutenberg University and that was described as a hollow tube with a dome top). When compressed the elongated molecules did not crack as do all other known molecules crack as do soap bubbles under any pressure. This was so reported in U.S. Pat. No. 5,143,745 to Maganas and Harrington. U.S. Pat. No. 6,264,908 to Maganas and Harrington, incorporated by reference, describes a process for forming silicon nitride particles and that was later found to also produce a elongated carbon tube (through chemistry which is not fully understood). The carbon-based elongated molecules separate or drop from the silicon nitrite particles, which produce two separate layers. The top layer is broken debris made up as silicon nitride particles that appear as tubes of various sizes when seen with a standard electron microscope and microscopically seen as incomplete film, or with complete pods that resemble fig leaves, and which is debris of little or no value. Many experts in the field of nano material have mistaken such silicon tubes as carbon based or graphite based tubes. The base layer is made up of elongated carbon-based molecules that, when aligned, form an uncontaminated monomolecular film beneath the silicon nitrite pods (i.e., that appear as fig leaf shaped debris).

A similar or duplicate reaction was discovered in CVD, or Chemical Vapor Deposition, and lead to a second method of production of fullerenes and a third method that produced the same silicon nitrite particles and that produce the elongated carbon molecule from a diesel engine that catalytically produces Complete Combustion™. A fourth method used by Johannes Gutenberg University by collecting the elongated molecules used in their tests with includes today's standard method of arcing carbon rods. This method is the most inefficient way to collect such materials.

In contrast, the disclosed method is the most efficient way to produce the elongated carbon-based, nano-scale molecules that can be aligned to form a monomolecular film uses a reactor that produces hydroxyl radicals that cause reactions in diesel engine compression, that forms supercritical water as a gas that dissolves 18 non organic elements from injected fuel, including sulfur which is dissolved or refined to a trace of sulfate ash, (with a two thirds reduction of fuel under 80,000 lbs load tested by both EPA-DOT and CARB certified test agencies that performed both CFR 40-41 tests with and a great reduction of cost of diesel fuel) and prior to Complete Combustion™. At that point muons are produced as a byproduct of supercritical water at the point of Complete Combustion™ that absorb oxygen and dissolve unburned elements as fuel. The muon is basically a heavy electron that has an electrical charge identical to that of an electron. Andrei Sakharov and F. C. Frank predicted the phenomenon of muon-catalyzed reactions on theoretical grounds before 1950, and Y. B. Zel'dovitch wrote about the phenomenon of muon-catalyzed reactions in 1954. Each catalyzing muon has a life span of about 2.2 microseconds, as measured in its rest frame, and the entire cycle is dedicated to locating suitable isotopes with which to bind. The muon cycle is the critical step that lowers the normal exhaust average temperature from 707° F. exhaust is reduced to 49° C. output and Complete Combustion™ according to the Maganas Process. All standard diesel engines have incomplete combustion, producing soot, sulfur, and twenty three other methane and non methane hydrocarbon contaminants that are continually dumped into atmosphere with huge test data variations described in CFR 40-86.34 that legally requires 10% weighted averages. Whereas diesel engines equipped with Maganas catalytic converter produce data variations of 0.002% with Complete Combustion™ emission output at exhaust valve chamber is 99.995% oxygen, nitrogen, and a 80% depleted carbon dioxide, and proven by both 13 and 8 mode EPA mandated tests provided by EPA-DOT certified CFR 40-41 diesel with test data variations within 0.02%. The balance of the 0.005% includes a very small amount of the material that forms the unique elongated molecules.

Recently Johannes Gutenberg University in Mainz, Germany bombarded with electrons the elongated carbon-based molecule which was first discovered, described, and precisely measured that matched size and shape by both Al Harrington and Tom Maganas. The information was published by Rensselaer Polytechnic Institute that verified the existence of the elongated molecule that was collected by the arcing of carbon rods which is a common and expensive method of collecting nano particles, which forms huge amounts of dust and debris and are used in nano composites today. All four methods have a common chemistry (which reaction is not fully understood), is now easily seen with a new more powerful German electron microscope that produced a photograph of the elongated molecule and included a scale to measure precisely the shape and size of the carbon molecule that confirms Al Harrington, and Maganas 1987 claims. The most important part of the photo confirms that the elongated molecules are a derivative of silicon nitrite particles and elongated carbon molecules as a growth of silicon nitrite particles that, when seen with a standard electron microscope, appear as various sized tubes gathered as floating grape leaves, and photographically matched all four methods and confirmed all our (Maganas' and Harrington's) previous photos from CVD of fullerenes and now Johannes Gutenberg University photos. Rensselaer recently published the electron microscopic photo of the elongated molecules, which were produced by arcing carbon rods. They were aligned with nano wire then bombarded with electrons at a single dwarfed nano carbon molecule that cracked when electron pressures reached 40 gigapascals, or (400,000) atmospheres of pressure. The recent report from Gutenberg University in Mainz, Germany, was reported and certified by Rensselaer Polytechnic Institute, and was recognized by many other German universities, as well as The University of Finland and Cornell University in the USA. An electron microscopic photo was later released by Gutenberg University of our unique elongated molecule fully sized attached to silicon particles, which was described in U.S. Pat. No. 6,264,908 referred to above.

The unique elongated molecules are resistant to electrical and mechanical friction. They eliminate the problem of corona discharge from electrical transmission lines by enclosing the cable with a structure (e.g., a tube, wrap or other enclosure) that can support monomolecular film deposited structure would produce three functions: (1) reducing friction, (2) eliminating corona discharge, and (3) inhibiting weathering of the structure. The unique elongated carbon-based molecules, when aligned, form a monomolecular film that are useful in solving other major problems, which include problems in aircraft, such as aluminum scratches, problems with aircraft lift, and that would replace a ceramic coating produced in Italy.

Figure 6:
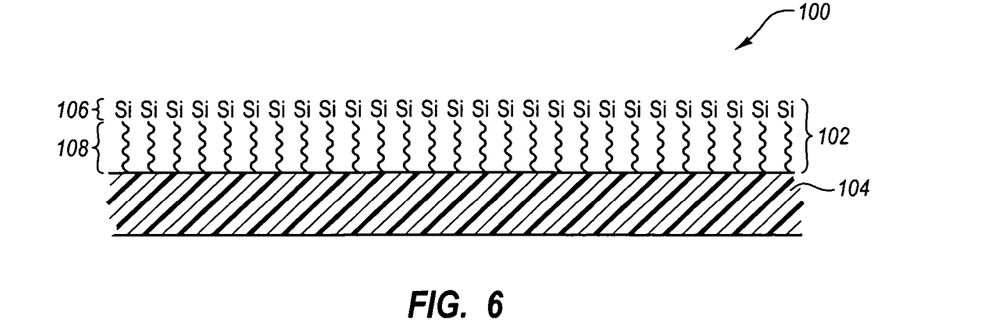
FIG. 6 is a cross-sectional schematic view of a substrate with elongated, nano-scale carbon-based molecules that when aligned form a monomolecular carbon-based film on a surface thereof.

FIG. 6 schematically illustrates a treated metal article 100 that includes a monomolecular carbon-based film 102 deposited on a surface of a metal substrate 104. The monomolecular carbon-based film 102 is comprised initially of an outer layer 106 of silicon or silicon nitride and an inner layer 108 of a carbonaceous (e.g., graphitic) strand (e.g., a carbon nanotube or other ordered graphitic carbon material). The inner layer 108 includes individual molecules which are arranged generally parallel to each other and perpendicular to the surface of the substrate 104. The metal substrate may comprise any desired metal that can be formed into a desired shape of a shield (e.g., iron, steel, copper, aluminum, and the like). The outer layer 106 of silicon or silicon nitride can be removed or left in place as desired.

The monomolecular carbon-based film 102 is remarkably smooth, resistant to chemical attack, and, in combination with the metal substrate 104, provides a shield that prevents penetration of electrons. This permits more efficient transmission of electrical power through a power line shielded by a metal tube or other structure that includes the monomolecular carbon-based film.

Figure 7:
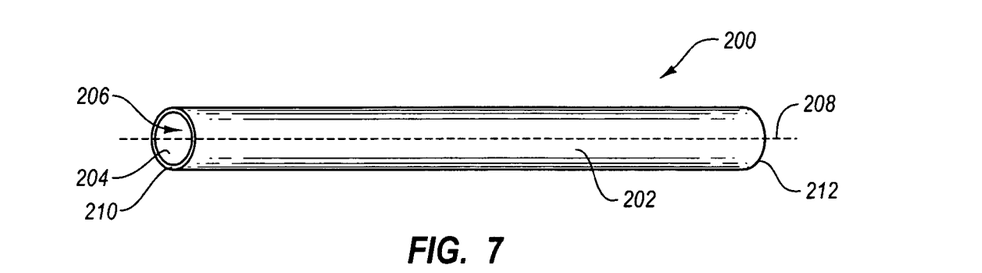
FIG. 7 is a perspective view that illustrates a monomolecular carbon-based film comprised of aligned carbon-based molecules deposited on a surface of a tubular electrical power cable shield.

FIG. 7 illustrates an electrical cable shield or tube 200 that includes an outer surface 202, an inner surface 204, and a hollow interior 206 into which an electrical power line or other wire can be inserted. The inner surface 204 includes the monomolecular carbon-based film in order to insulate, shield and prevent passage of electrons, such as via corona discharge. The outer surface 202 may also include the monomolecular carbon-based film in order to guard against corrosion and provide long-term stability of the shield when exposed to the elements. The tube 200 extends along a longitudinal axis 208 between a first end 210 and a second end 212. The film may be deposited in every part of the tube. The tube 200 may be a solid pipe or a flexible tape treated with the monomolecular film that is wrapped around a power line.

Figure 8:
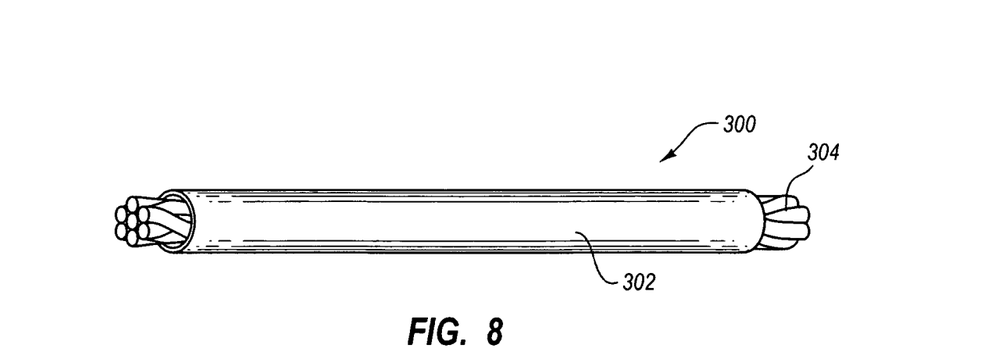
FIG. 8 is a perspective view that illustrates an electrical power cable encased within and electrically shielded by an electrical power cable shield covered on both the inside and outside surface with a monomolecular carbon-based film.

FIG. 8 illustrates an exemplary shielded power line 300, which is comprised of an electrical cable shield 302 encased around a power line 304. Depending on the length of the power line 304, the shield 302 may include multiple tubes 302 placed end to end. The shielded power line 300 may be placed into commission as shown, or it may be formed by retrofitting an existing power line 304 with one or more shields 302. The shielded power line 300 provides enhanced transmission of electrical power compared to an unshielded power line.

Figure 9:
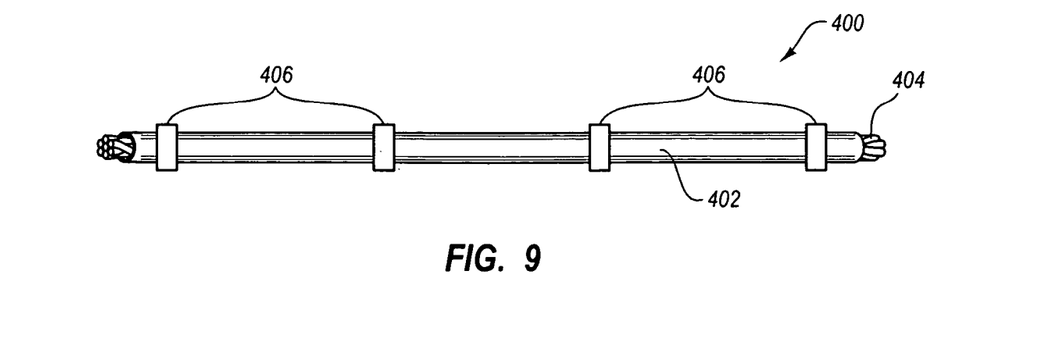
FIG. 9 is a perspective view that illustrates an electrical power cable encased within and electrically shielded within an electrical power cable shield and having magnets spaced-apart (e.g., by about 50-100 miles)

FIG. 9 illustrates an exemplary shielded electrical power line 400, which includes one or more monomolecular carbon-base film treated tubes 402 disposed around a power line 404. In order to further enhance power transmission through the power line 400, a plurality of magnets 406 are positioned at intervals along the shielded electrical power line 400 either inside or outside the tubes 402 as shown. The magnets 406 help to further prevent leakage of power along the power line 400. According to one embodiment, the magnets 406 may be designed to join and seal interfaces between individual tube segments 402. The magnets 406 may be spaced apart as desired, e.g., by a distance of approximately 20 feet, or within a range of about 1-50 feet, or about 5-40 feet, or about 10-30 feet. Alternatively, or in addition, large mega-sized magnets may be spaced apart by larger distances (e.g., about 100 miles, or about 1-200 miles, or about 20-180 miles, or about 50-150 miles).

The elongated carbon-based, nano-scale molecules that are aligned to form a monomolecular carbon-based film can be formed on any surface as a byproduct of nano technology that led to a diesel Catalytic Converter™ that produced "Complete Combustion™". This system includes a bed of silica and/or alumina particles that produce hydroxyl radicals, which are attracted to piston compression heat of 307° C., produce the hydroxyl radicals and subsequently supercritical water as a gas, and interact with injected diesel fuel to refine 18 known organic elements and reduces sulfur to a trace of sulfate ash. They subsequently produce muon methyl radicals. The bed interacts with gases from the diesel engine for 20 seconds upon ignition to generate highly reactive hydroxyl radicals that are believed to provide several benefits. The interaction between the bed of silica and/or alumina particles and gases from the diesel engine yields a modified gas stream that consists 99.995% of nitrogen, oxygen, and 80% depleted carbon dioxide, and a small but significant quantity of a byproduct that yields the monomolecular carbon-based film, which can be deposited on any substrate. If the substrate is an elongate sleeve, depositing the monomolecular carbon-based film on a surface thereof yields an electrical cable shield according to one embodiment of the disclosure.

Figure 10:
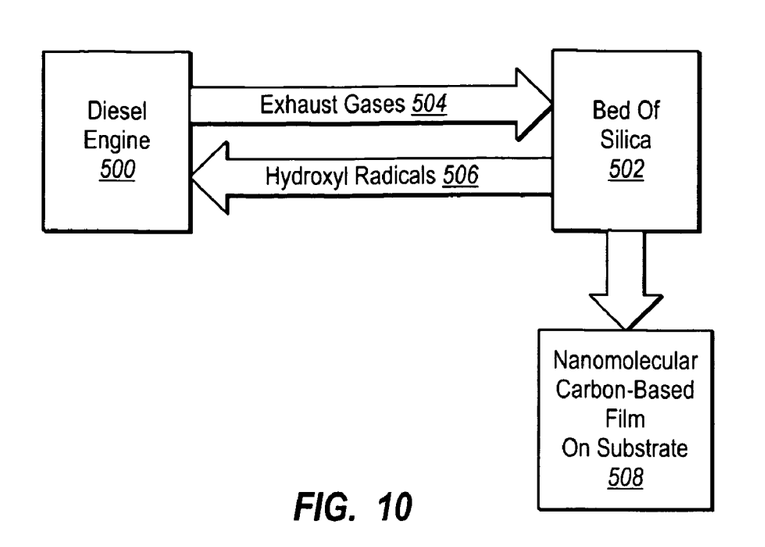
FIG. 10 is a box diagram that schematically illustrates a reaction chamber used in combination with a diesel engine for forming elongated, nano-scale carbon-based molecules that when aligned form a monomolecular carbon-based film.

FIG. 10 schematically illustrates a system that utilizes a diesel engine in combination with a reactor to produce the elongated carbon-based molecule that, when aligned, form the monomolecular film. FIG. 10 more particularly depicts the movement of exhaust gases and hydroxyl radicals between a diesel engine 500 and a bed 502 of catalytically reactive silica particles that produce hydroxyl radicals, which are hydrated at compression friction temperatures of 307° C. Supercritical water is formed as a gas plasma that produce muon methyl radicals to create complete combustion in the cylinders, which simultaneously refines 18 inorganic elements from injected fuel in compression. The modified exhaust stream which exits the exhaust manifold is channeled to the bed of silica 502 by means of an exhaust conduit. Interaction between the exhaust gases 504 and the bed of silica 502 yields a highly reactive atmosphere comprising highly reactive hydroxyl radicals 506. The returned hydroxyl radicals 506 are dehydrated at the catalyst temperature at 49° C. then return to a compression temperature of 307° C. This forms a constant cycle of highly energized hydroxyl radical 506. It is believed that the hydrated hydroxyl radicals 506 form supercritical water as a gas plasma at compression within the cylinders, which greatly increases the efficiency of the engine, eliminates soot and fuel blow-by, and reduces top combustion temperatures of 550° C. to 700° C. The result is 99.995% oxygen, nitrogen and 80% reduction of $CO_2$ with reduced combustion temperatures compared to conventional diesel engines. In addition, a monomolecular carbon-based material 508 is produced and can be deposited onto a metallic or any none metallic substrate in fluid contact with gases contained within or emitted from the bed of silica 502.

Figure 11:
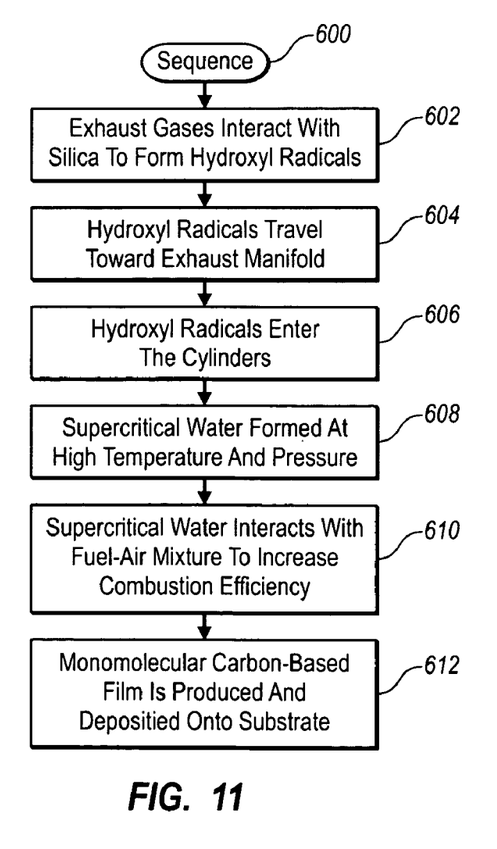
FIG. 11 is a flow chart showing the various steps involved in changing incomplete combustion to nearly complete combustion efficiency of a diesel engine and concomitant formation and deposit of elongated, nano-scale carbon-based molecules that when aligned a substrate to form a monomolecular carbon-based film.

FIG. 11 is a flow diagram showing a sequence 600 including the various steps and reactions involved forming a monomolecular carbon-based film. In a first step 602, exhaust gases interact with silica and/or alumina to form hydroxyl radicals. In a second step 604, a stream of hydroxyl radicals travels toward the exhaust manifold of the diesel engine. In a third step 606, the hydroxyl radicals enter the cylinders. In a fourth step 608, the hydroxyls form supercritical water as a gas plasma with methyl muon radicals at high temperature and pressure. In a fifth step 610, the supercritical water interacts with the fuel-air mixture in order to greatly increase combustion efficiency, eliminate soot and fuel blow-by, and reduce combustion temperature. In a sixth step 612, a byproduct in the form of a monomolecular carbon-based film is produced and deposited on metallic substrates placed into contact with gases produced by the foregoing sequence.

The reactions of the invention also reduce the temperature of the exhaust. Whereas typical specifications are for temperatures averaging 706° F. at the muffler, exhaust temperatures emitted from the catalytic bed of silica were found to be as low as 49° C. (i.e., cool enough that moisture could be collected using a wax coated cup in one instance). The exhaust stream gases inside the reaction chamber were tested and found to be 49° C.

In general, it is currently believed that the "operating temperature" (i.e., the temperature at which the catalytic particles are able to produce a reactive atmosphere of highly reactive hydroxyl radicals, supercritical water and/or other reactive species (possibly muon radicals) and also form the monomolecular carbon-based film) may be as low as about 49° C. and as high as about 375° C. The catalytic systems used to form the monomolecular film according to the invention can be modified, such as by upscaling or downscaling, to catalytically treat virtually any waste exhaust stream which includes combustion products of carbon-containing fuels.

According to an alternative embodiment, a monomolecular carbon-based film can be deposited onto a metal sleeve using other methods, including chemical vapor deposition (CVD). Appropriate reagents (i.e., organic molecules, silane, ammonia, nitrogen, and a source of fluorine such as fluorocarbon, which is the initial instance was a contaminant) are heated to form a plasma, which is then deposited onto a metal substrate to form the monomolecular carbon-based film. However, while CVD forms a useful deposit or film on a metal substrate, it is generally not as readily scalable as the aforementioned method that utilizes waste exhaust gases from a diesel engine and a reactor comprising a bed of silica and/or alumina particles.

EXAMPLE 1

A monomolecular carbon-based film as described above was produced by passing emissions from a diesel engine through a reactor containing silica particles (e.g., as in FIG. 9) and deposited onto a 3/16 inch thick steel bar. The monomolecular carbon-based nanomaterial created a smoother surface that was lubricious to the touch. The elongated carbon-based molecules lie shoulder to shoulder yield a structure that seats with a vacuum to the steel bar or any other substrate. Each molecule becomes a shock absorber and reduces friction. This deposit could not be scratched off (e.g., with a chisel) or burned. The film comprised of the monomolecular film sealed the bar and prevented oxidation. For example, a similarly coated steel bar was placed into ocean water for 30 days but showed no signs of oxidation, which was surprising since steel is readily oxidized in the presence of salt water from the Pacific Ocean.

The steel bar with the monomolecular carbon-based film was tested by passing a current through the interior of the steel bar (i.e., through the two ends, which had screws to introduce current at a voltage of 110 and 220 volts). A voltage was applied at one end of the steel bar, which caused a current to pass through the steel bar. The sides of the steel bar that included the monomolecular carbon-based film were found to be electrically insulated and did not permit passage therethrough of any current or electromagnetic radiation except through the end screw which was electrified. More surprisingly, placing magnets above and below the steel bar (i.e., the north pole adjacent to one side and the south pole adjacent to the opposite side) increased voltage across the steel bar, thereby apparently boosting the power of the current passing through the steel bar. From this it may be predicted that placing magnets periodically along an electrical power line shielded using electrical cable shields according to the invention can further boost power through the power line and reduce or eliminate voltage losses. It may also be predicted that the use of the monomolecular carbon-based film on a metal substrate and in combination with magnets can act as a "battery" or a generator alternative power source by producing a constant magnetic alternating current between both sides of the monomolecular carbon-based film.

EXAMPLE 2

A monomolecular carbon-based film produced by passing emissions from a diesel engine through a reactor containing silica particles (e.g., as in FIG. 9) was deposited onto a rusted 1/4 inch thick steel bar that had a coating of rust on the surface. The monomolecular carbon-based nanomaterial created a smoother surface that was more lubricious to the touch. This deposit could not be scratched off (e.g., with a chisel) or burned. The film sealed the rusty bar and prevented rust from being rubbed off after four years, as was possible prior to treating the rusty bar with the monomolecular carbon-based film.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An electrical cable shield for use in enhancing transmission of electricity over an electrical power line, comprising:
   an elongate sleeve having a longitudinal axis, a first end, a second end, and inner and outer walls extending between the first and second ends, the elongate sleeve being composed of at least one type of metal;
   a hollow interior defined by the inner wall of the sleeve, disposed along the longitudinal axis of the sleeve, and configured for insertion of an electrical power line therethrough; and
   a monomolecular carbon-based film formed by aligning elongated carbon-based molecules deposited on the inner and outer walls of the sleeve, the monomolecular carbon-based film providing a barrier that inhibits rust, friction and penetration of electrons emitted by corona discharge by an electrical power line positioned through the hollow interior of the shield.

2. An electrical cable shield as in claim 1, wherein the elongate sleeve is a metal tube.

3. An electrical cable shield as in claim 2, wherein the metal tube comprises at least one metal selected from the group consisting of iron, steel, aluminum, and copper.

4. An electrical cable shield as in claim 2, the monomolecular film further providing corrosion resistance to the metal of the elongate sleeve.

5. An electrical cable shield as in claim 1, wherein the elongate sleeve is formed from a flexible material wrapped to form the elongate sleeve.

6. An electrical cable shield as in claim 1, further comprising one or more magnets positioned within the shield.

7. An electrical cable shield as in claim 6, wherein the magnets are positioned inside the elongate sleeve.

8. A method of manufacturing an electrical cable shield for use in enhancing transmission of electricity through an electrical power line, comprising:
   operating a diesel engine coupled to a reactor containing a fluidized bed of silica and/or alumina particles to produce dehydrated hydroxyl radicals that form supercritical water as a gas plasma within cylinders of the diesel engine at piston compression and muon methyl radicals a product of the supercritical gas plasma and yield a modified exhaust stream that exits the reactor;
   contacting the modified exhaust stream with an elongate sleeve having inner and outer walls or an intermediate substrate having upper and lower surfaces that can be formed into a sleeve, the or intermediate substrate being composed of at least one type of metal; and
   causing or allowing a monomolecular carbon-based film to form on the elongate sleeve or intermediate substrate through alignment of elongated carbon-based molecules on, the monomolecular carbon-based film providing a barrier that inhibits penetration of electrons emitted by an electrical power line when the shield is positioned around the electrical power line.

9. A method as in claim 8, wherein the exhaust stream is produced by a diesel engine, the reactor producing hydroxyl radicals within 30 seconds of diesel ignition, and thereafter the diesel engine having essentially complete combustion in which is 99.995% of the exhaust gases produced thereby include oxygen, nitrogen and 80% depleted $CO_2$ with a drop in exhaust temperature to 49° C.

10. A method as in claim 8, wherein the barrier inhibits penetration of electrons, resists oxidation, and cannot be scratched or burned off.

11. A method as in claim 8, wherein the reactor causes diesel fuel to be refined by separating 18 inorganic elements from the diesel fuel, which is completely consumed and which increases power of the diesel engine, with a two-thirds decrease in fuel consumption.

12. A method as in claim 8, further comprising positioning one or more divided or solid tapered magnets within the elongate sleeve.

13. A method as in claim 12, wherein the magnets generated increased voltage within the shield by creating a continuous corona circle and bombarding the shield with electrons from divided U-shaped magnets.

14. A shielded electrical power cable having reduced power loss and enhanced electrical transmission, comprising:
   an electrical cable having a woven wires; and
   an electrical cable shield that surrounds the electrical cable, the electrical cable shield comprising:
      an elongate sleeve having a longitudinal axis, a first end, a second end, and inner and outer walls extending between the first and second ends, the elongate sleeve being composed of at least one type of metal;
      a hollow interior defined by the inner wall of the sleeve, which is disposed along the longitudinal axis of the sleeve and configured for insertion of the electrical wire therethrough; and
      a monomolecular carbon-based film having aligned elongated carbon-based molecules on the inner and outer walls of the sleeve, the monomolecular carbon-based film providing a barrier that inhibits penetration of electrons from the electrical cable.

15. A shielded electrical cable as in claim 14, the electrical cable comprising an electric power line which carries alternating current or direct current.

16. A shielded electrical power cable as in claim 14, further comprising magnets spaced miles apart and positioned within the electrical cable shield.

17. A method of shielding an electrical power line in order to reduce power loss and enhance electrical transmission, comprising:
   providing an electrical power line; and
   positioning an electrical cable shield so as to at least partially surround and enclose the electrical power line, the electrical cable shield comprising:
      an elongate sleeve having a longitudinal axis, a first end, a second end, and inner and outer walls extending between the first and second ends, the elongate sleeve being composed of at least one type of metal;
      a hollow interior defined by the inner wall of the sleeve, which is disposed along the longitudinal axis of the sleeve and configured for insertion of the electrical power line therethrough; and
      a monomolecular carbon-based film having aligned elongated carbon-based molecules on the inner and outer walls of the sleeve, the monomolecular carbon-based film providing a barrier that inhibits penetration of electrons from the electrical power line.

18. A method as in claim 17, further comprising placing one or more magnets within the shield to surround the cable with precise divisions to the electrical wire shield in order to boost electrical power or increase voltage over the electrical power line.

19. A method as in claim 18, wherein the magnets boost voltage and power of the electricity transmitted over the electrical power line.

20. A method as in claim 17, further comprising placing one or more magnets adjacent to the electrical wire shield in order to boost electrical power through the electrical power line.

21. A method of transmitting electricity over an electrical power line with reduced power loss and enhanced electrical transmission, comprising:
   providing a shielded electrical power line comprised of:
      an electrical power line; and
      an electrical cable shield that at least partially surrounds and encloses the electrical power line, the electrical cable shield comprising:
         an elongate sleeve having a longitudinal axis, a first end, a second end, and an outer wall extending between the first and second ends, the elongate sleeve being composed of at least one type of metal;
         a hollow interior defined by the inner wall of the sleeve, which is disposed along the longitudinal axis of the sleeve and configured for insertion of the electrical power line therethrough; and
         a monomolecular carbon-based film having aligned molecules on the inner and outer walls of the sleeve, the monomolecular carbon-based film providing a barrier that inhibits electron penetration through the monomolecular film and eliminating corona discharge of electrons otherwise generated by atmospheric pressure on an open electrical power line; and transmitting electricity over the electrical power line, the electrical wire shield reducing power loss and enhancing electrical transmission.

22. A method as in claim 21, the shielded electrical power line further comprising a plurality of magnets periodically spaced apart and positioned within the electrical cable shield.

23. An electrical cable shield for use in enhancing transmission of electricity through an electrical power line, comprising:
- an elongate sleeve having a longitudinal axis, a first end, a second end, and inner and outer walls extending between the first and second ends, the elongate sleeve being composed of at least one type of metal;
- a hollow interior defined by the inner wall of the sleeve, disposed along the longitudinal axis of the sleeve, and configured for insertion of an electrical power line therethrough; and
- a monomolecular carbon-based film having aligned elongated carbon-based molecules deposited on the inner and outer walls of the sleeve, the monomolecular carbon-based film providing a barrier that inhibits penetration of electrons emitted by an electrical power line positioned through the hollow interior of the shield.

24. An electrical cable shield as in claim 23, wherein the elongate sleeve is a metal tube.

25. An electrical cable shield as in claim 24, wherein the metal tube comprises at least one metal selected from the group consisting of iron, steel, aluminum, and copper.

26. An electrical cable shield as in claim 24, the monomolecular film further providing corrosion resistance to the metal of the elongate sleeve.

27. An electrical cable shield as in claim 23, wherein the elongate sleeve is formed from a flexible material wrapped to form the elongate sleeve.

28. An electrical cable shield as in claim 23, further comprising one or more magnets positioned adjacent to the elongate sleeve.

29. An electrical cable shield as in claim 23, wherein the electrical cable shield increases output voltage compared to input voltage.

30. A method of manufacturing an electrical cable shield for use in enhancing transmission of electricity through an electrical power line, comprising:
- passing an exhaust stream produced while burning a carbon-based fuel through a reactor containing a bed of particles comprised of at least one of silica or alumina particles to yield a modified exhaust stream that exits the reactor;
- contacting the modified exhaust stream with an elongate sleeve having inner and outer walls or an intermediate substrate having upper and lower surfaces that can be formed into a sleeve, the or intermediate substrate being composed of at least one type of metal; and
- causing or allowing a monomolecular carbon-based film to form on the inner and outer walls of the elongate sleeve or the upper or lower surfaces of the intermediate substrate, the monomolecular carbon-based film comprising aligned elongated carbon-based molecules, the monomolecular carbon-based film providing a barrier that inhibits penetration of electrons emitted by an electrical power line.

31. A method as in claim 30, further comprising positioning one or more magnets adjacent to the elongate sleeve.

32. A shielded electrical power cable having reduced power loss and enhanced electrical transmission, comprising:
- an electrical cable having a bundle of individual wires; and
- an electrical cable shield that surrounds the electrical cable, the electrical cable shield comprising:
  - an elongate sleeve having a longitudinal axis, a first end, a second end, and inner and outer walls extending between the first and second ends, the elongate sleeve being composed of at least one type of metal;
  - a hollow interior defined by the inner wall of the sleeve, which is disposed along the longitudinal axis of the sleeve and configured for insertion of the electrical wire therethrough; and
  - a monomolecular carbon-based film having aligned elongated carbon-based molecules on the inner and outer walls of the sleeve, the monomolecular carbon-based film providing a barrier that inhibits penetration of electrons from the electrical cable.

33. A shielded electrical power cable as in claim 32, further comprising magnets periodically spaced apart and positioned adjacent to the electrical cable shield.

34. A method of transmitting electricity through an electrical power line with reduced power loss and enhanced electrical transmission, comprising:
- providing a shielded electrical power line comprised of:
  - an electrical power line; and
  - an electrical cable shield that at least partially surrounds and encloses the electrical power line, the electrical cable shield comprising:
    - an elongate sleeve having a longitudinal axis, a first end, a second end, and an outer wall extending between the first and second ends, the elongated sleeve being composed of at least one type of metal;
    - a hollow interior defined by the inner wall of the sleeve, which is disposed along the longitudinal axis of the sleeve and configured for insertion of the electrical power line therethrough; and
    - a monomolecular carbon-based film having aligned molecules on the inner and outer walls of the sleeve, the monomolecular carbon-based film providing a barrier that inhibits penetration through the monomolecular film of an electromagnetic field generated by the electrical power line; and
- transmitting electricity through the electrical power line, the electrical wire shield reducing power loss and enhancing electrical transmission.

35. A method as in claim 34, the shielded electrical power line further comprising a plurality of magnets periodically spaced apart and positioned adjacent to the electrical cable shield.

36. A method as in claim 34, the magnets boosting voltage and power of the electricity being transmitted through the electrical power line.

* * * * *

UNITED STATES PATENT AND TRADEMARK OFFICE
CERTIFICATE OF CORRECTION

PATENT NO. : 7,759,579 B2  
APPLICATION NO. : 12/396609  
DATED : July 20, 2010  
INVENTOR(S) : Maganas Page 1 of 3

It is certified that error appears in the above-identified patent and that said Letters Patent is hereby corrected as shown below:

Drawings
Sheet 9, replace Figure 10 with the figure depicted below, wherein "Nanomolecular Carbon-Based Film on Substrate 508" has been changed to --Monomolecular Carbon-Based Film on Substrate 508--

FIG. 10

Column 1
Line 23, change "precisely" to --precise--
Line 36, change "by a Dr." to --by Dr.--
Line 55, change "currant" to --current--
Line 57, change "there are is reliable way" to --there is a reliable way--
Line 59, change "transmission insulation" to --transmission, insulation--

Signed and Sealed this
Eleventh Day of January, 2011

David J. Kappos
*Director of the United States Patent and Trademark Office*

Column 3
Line 4, change "surface" to --surfaces--
Line 18, change "aligned a substrate" to --aligned with a substrate--
Line 31, change "the an electron" to --the electron--
Line 56, change "durable and" to --durable,--

Column 5
Line 13, change "currant" to --current--
Line 35, change "produce a elongated" to --produce an elongated--
Line 51, change "lead" to --led--
Line 62, change "film uses" to --film that uses--

Column 6
Line 17, change "is" to --and--
Line 21, after "into" insert --the--
Line 26, change "at exhaust valve" to --at the exhaust valve--
Line 27, change "and a 80%" to --and 80%--
Line 47, change "Al Harrington," to --Al Harrington--

Column 7
Line 8, after "support" insert --a--
Line 9, change "would" to --and--
Line 13, change "that are useful" to --that is useful--

Column 8
Line 42, change "produce" to --produces--
Line 53, change "radical" to --radicals--

Column 9
Line 38, change "which is the" to --which in the--

Column 10
Line 19, change "generator alternative power" to --generator of an alternative power--

Column 11
Line 18, after "radicals" insert --as--
Line 24, change "the or intermediate" to --the intermediate--
Line 29, delete "on"
Line 37, change "which is 99.995%" to --which 99.995%--
Line 57, change "having a woven wires" to --having woven wires--

Column 13
Line 53, change "the or intermediate" to --the intermediate--

Column 14
Line 37, change "elongated" to --elongate--